(12) United States Patent
Rodney et al.

(10) Patent No.: US 7,363,971 B2
(45) Date of Patent: Apr. 29, 2008

(54) METHOD AND APPARATUS FOR MAINTAINING A MULTI-CHIP MODULE AT A TEMPERATURE ABOVE DOWNHOLE TEMPERATURE

(75) Inventors: Paul F. Rodney, Spring, TX (US); James E. Masino, Houston, TX (US); Roger L. Schultz, Aubrey, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 540 days.

(21) Appl. No.: 10/702,836

(22) Filed: Nov. 6, 2003

(65) Prior Publication Data

US 2005/0098318 A1    May 12, 2005

(51) Int. Cl.
*E21B 47/00* (2006.01)
(52) U.S. Cl. .............. 166/254.2; 166/66; 166/57; 73/152.54; 257/686
(58) Field of Classification Search .............. 166/57, 166/254.2, 66; 73/152.54; 257/686
See application file for complete search history.

(56) References Cited

U.S. PATENT DOCUMENTS

| | | | | |
|---|---|---|---|---|
| 4,391,846 A | * | 7/1983 | Raymond | ............ 257/E21.006 |
| 5,523,619 A | * | 6/1996 | McAllister et al. | ......... 257/686 |
| 5,720,342 A | * | 2/1998 | Owens et al. | ................. 166/57 |
| 6,263,730 B1 | * | 7/2001 | Grande et al. | ............ 166/254.2 |
| 6,499,545 B1 | * | 12/2002 | MacGugan | ................. 166/66 |
| 6,614,718 B2 | * | 9/2003 | Cecconi et al. | ........... 73/152.54 |
| 7,017,662 B2 | * | 3/2006 | Schultz et al. | ............ 166/254.2 |
| 2002/0125966 A1 | | 9/2002 | Gunawardana et al. | |

OTHER PUBLICATIONS

John R. Vig, "Quartz Crystal Resonators and Oscillators For Frequency Control and Timing Applications, a Tutorial," Chapters 2, 6 and 8; Jan. 2001.
Pending U.S. Appl. No. 10/702,836.

* cited by examiner

*Primary Examiner*—Richard E. Chilcot, Jr.
*Assistant Examiner*—Matthew J Smith
(74) *Attorney, Agent, or Firm*—Mark E. Scott; Conley Rose, P.C.

(57) ABSTRACT

Methods and systems for operating integrated circuits at temperatures higher than expected ambient temperatures. The heating may be of entire circuit boards, portions of the circuit boards (such as the components within a multiple-chip module) and/or single devices. Methods and related systems may be used in any high temperature environment such as downhole logging tools, and the devices so heated are preferably of silicon on insulator semiconductor technology.

9 Claims, 2 Drawing Sheets

METHOD AND APPARATUS FOR MAINTAINING A MULTI-CHIP MODULE AT A TEMPERATURE ABOVE DOWNHOLE TEMPERATURE

CROSS-REFERENCE TO RELATED APPLICATIONS

None

STATEMENT REGARDING FEDERALLY SPONSORED RESEARCH OR DEVELOPMENT

Not applicable.

BACKGROUND OF THE INVENTION

1. Field of the Invention

The various embodiments of the present invention are directed to high temperature circuits for use in high temperature environments. More particularly, at least some embodiments of the invention are directed to high temperature circuits for use in downhole logging tools.

2. Background of the Invention

In the exploration for and extraction of subterranean hydrocarbons, downhole tools are used to determine characteristics of formations traversed by a borehole. In some cases, the downhole tools may be wireline tools which are suspended in a borehole after the drill string has been removed or "tripped." In other cases, the downhole tools may comprise measuring-while-drilling (MWD) and logging-while-drilling (LWD) tools coupled within the drill string.

Regardless of the mechanism by which a downhole tool is placed within a borehole, the range of temperatures within which the tool must operate may vary widely. For example, a downhole tool placed within a borehole may experience an ambient temperature of approximately 20° C. near the surface, and at depth experience temperatures as high as or exceeding 200° C. Because many of these downhole tools, especially MWD and LWD tools, have onboard electronics which may be semiconductor devices, these semiconductor devices need to be operable over the wide range of temperatures.

Many commercially available semiconductor devices do not operate properly in ambient conditions approaching or exceeding 200° C. Even if a semiconductor device is operational at high temperature, its operating characteristics may change with temperature. For example, logic gates may experience a significant change in the gate delay associated with signal propagation through the gates. Amplifier gain may change as a function of ambient temperature. Charged cell-type memory devices may lose their storage charge more quickly, thus requiring more frequent refresh cycles. While it may be possible to cool downhole devices to be within the normal operating ranges, the implementation of downhole cooling is difficult and extremely inefficient.

Thus, downhole tool manufacturers are relegated to testing the out of specification operating characteristics of commercially available semiconductor devices, using only those devices that still operate in the out of specification temperature conditions, and compensating for changes in operating characteristics caused by excessive temperature swings.

SUMMARY OF SOME OF THE PREFERRED EMBODIMENTS

The problems noted above are solved in large part by a method and related system that controls the temperature of an electronic device, or group of electronic devices, to be above the expected ambient temperature. One of the exemplary embodiments may be a method comprising placing a downhole tool within a borehole proximate to an earth formation (the downhole tool comprising an electronic circuit board), and maintaining at least a portion of the set of components on the electronic circuit board at a predetermined temperature in excess of expected downhole temperatures. Some embodiments may involve placing a downhole tool having a silicon on sapphire integrated circuit in the set of components maintained at the predetermined temperature.

Other exemplary embodiments may comprise a downhole tool that has a tool body (configured for placement within a borehole), and an electronic circuit board coupled within the tool body (the electronic circuit board comprising a plurality of electronic components). In these embodiments at least a portion of the electronic components on the electronic circuit board are maintained at a predetermined temperature above the highest temperature expected to be encountered by the downhole tool within the borehole.

The disclosed devices and methods comprise a combination of features and advantages which enable it to overcome the deficiencies of the prior art devices. The various characteristics described above, as well as other features, will be readily apparent to those skilled in the art upon reading the following detailed description, and by referring to the accompanying drawings.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

The term "integrated circuit" refers to a semiconductor based component, or a group of components, designed to perform a specific task. In its initial stages, an integrated circuit may take the form of a substantially circular disk or "wafer" upon which various layers are constructed to implement the desired functionality. A "singulated integrated circuit" refers to a single component or group of components created on a wafer using semiconductor technology, but wherein the individual component or group of components has been cut (singulated) from the wafer.

DETAILED DESCRIPTION OF THE PREFERRED EMBODIMENTS

Embodiments of the various inventions were developed in the context of downhole logging and measuring tools. Because of this developmental context, the following description relates to downhole logging tools. However, the systems and methods are equally applicable to other situations where high ambient temperature is expected, and therefore the description should not be read as limiting the scope of the disclosure to just downhole logging tools.

Figure 1:
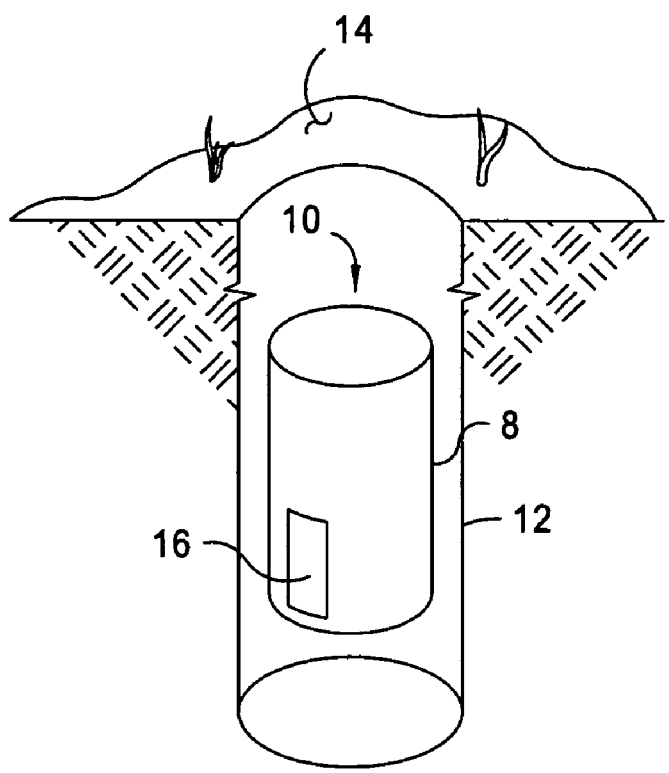
FIG. 1 illustrates a downhole tool within a borehole.

FIG. 1 illustrates a downhole tool 10 constructed in accordance with embodiments of the invention. In particular, downhole tool 10 may comprise a tool body 8 disposed within a borehole 12 beneath the surface 14 of the earth. Tool 10 may be, for example, a measuring-while-drilling (MWD) or logging-while-drilling (LWD) tool coupled within a drill string. Alternatively, tool 10 may be a wireline-type tool, suspended in the borehole by way of an armored multi-conductor cable (not shown). Regardless of the precise mechanism by which the tool 10 is placed and held within the borehole 12, the downhole tool may comprise an electronic circuit board 16. Because the electronic circuit board 16 is integral with the tool 10, the components on the electronic circuit board 16 may experience a significant range of temperatures (e.g., from 20° C. at the surface to 200° C. at depth). The precise nature of the electronic circuit board 16 may vary depending upon the type of downhole tool 10. If the downhole tool 10 is an exemplary electromagnetic wave resistivity (EWR) tool, the electronic circuit board 16 may comprise components to implement signal generators, amplifiers and receivers. If the downhole tool 10 is an exemplary neutron or gamma tool, the electronic circuit board 16 may comprise components to implement control of the neutron and/or gamma source, and neutron/gamma detection circuits.

In accordance with embodiments of the invention, at least a portion of the components on the electronic circuit board 16 may be heated to a temperature higher than the expected downhole temperature. In this way, variation in operation characteristics of semiconductor devices may be reduced. The following paragraphs describe various embodiments for controlling the temperature of at least a portion of the components on the electronic circuit board 16.

Figure 2:
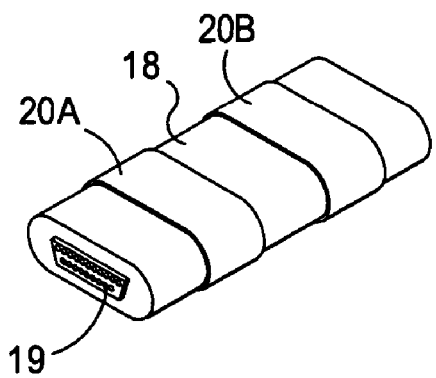
FIG. 2 illustrates a heated flask.
Figure 3:
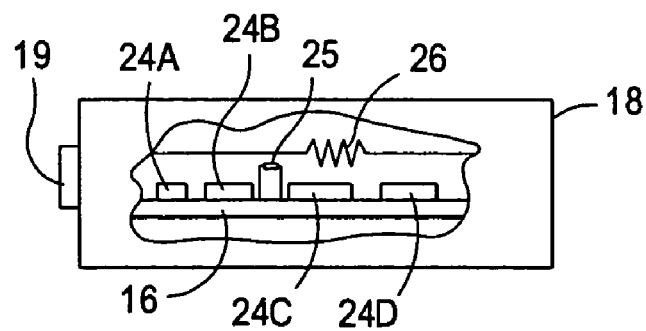
FIG. 3 illustrates a cutaway side view of at least some embodiments of the heated flask.

FIG. 2 illustrates embodiments where the electronic circuit board 16 may be placed within a sealed, possibly metallic, container 18 (which may also be known as a "flask"). Electrical signals may couple to and from the electrical components in the flask by way of a connector 19. In the embodiments illustrated in FIG. 2, components of the electronic circuit board 16 in the flask 18 may be heated to the predetermined temperature. In some embodiments, heating the flask 18 may be by way of a heating element 20 coupled to an outside portion of the flask 18 (in FIG. 2, two heating elements are illustrated and labeled 20A and 20B). In other embodiments, the heating element may be within the flask 18. FIG. 3 illustrates a cut-away side view of the flask 18 showing an exemplary electronic circuit board 16 having various components 24 mounted thereon (in FIG. 3, four such components are illustrated and labeled 24A, 24B, 24C and 24D). In the alternative embodiments, a heating element 26 (possibly a resistive heater) may be placed within the flask. The temperature within the flask 18 may be controlled to the desired temperature, as measured by a temperature sensing device 25, which could be a thermocouple or resistive thermal device (RTD).

Although it may be possible to control the temperature of all the electrical components in a downhole tool to be greater than expected downhole temperatures, there may be some components whose operating characteristics may change little with temperature, or may change in such a way that does not affect operation of the components. For this reason, in alternative embodiments of the invention only a portion of the electrical components within a downhole tool 10 may be temperature controlled. The manner in which the temperature of a component is controlled may be a function of a number of components for which temperature control is desired. In some embodiments, only a portion of the total electronic components for the downhole tool 10 may be placed within a flask, and only that portion heated in the manner as discussed with respect to FIGS. 2 and 3. In yet further alterative embodiments of the invention, a plurality of components may be combined into a single packaged semiconductor device, such as a multiple chip module (MCM), and the components within the module may be temperature controlled.

Figure 4:
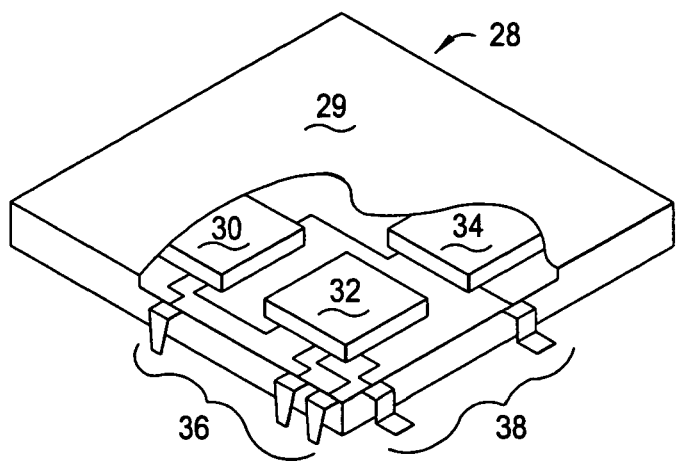
FIG. 4 illustrates a cutaway perspective view of a multiple-chip module.

FIG. 4 illustrates a MCM 28 in accordance with various embodiments of the invention. In particular, FIG. 4 shows the MCM 28 having a partial cut-a-way to expose components therein. In at least some embodiments of the invention, integrated circuits singulated from a wafer may be used. FIG. 4 illustrates three such singulated semiconductor dies 30, 32 and 34 enveloped in an encapsulant 29. The encapsulant 29, possibly in the form of an epoxy based material, may completely fill the space between the components, or the encapsulant may be a small box within which the electrical components 30, 32 and 34 are housed. Within the MCM 28, electrical conductors may couple the various components 30, 32 and 34 so that the MCM 28 performs a desired task. Moreover, some or all of the integrated circuits 30, 32 and 34 may also couple to external pins of various construction. The exemplary MCM 28 of FIG. 4 illustrates two types of external pins through which the internal devices may communicate with external devices. In particular, a plurality of leads 36 are illustrated on one edge of the MCM 28. In embodiments having leads such as 36, a corresponding set of leads may be present on the opposite side of the module, and thus the MCM 28 would couple to a printed circuit board in a fashion similar to dual in-line package products. FIG. 4 also illustrates a packaging technique by showing the plurality of leads 38. Leads 38 as illustrated may be utilized in a quadrant package (quad pack) construction. In quad pack construction, the exemplary leads 38 may extend from all four of the sides (not specifically shown in FIG. 4). Other mechanisms may be used to electrically couple external devices to the integrated circuits within the MCM 28, such as a pin grid array.

Regardless of the precise mechanism by which components in a multi-chip module couple to external devices, in accordance with embodiments of the invention an individual MCM 28 may be temperature controlled to hold components internal to the MCM 28 at temperatures above expected ambient temperatures.

Figure 5:
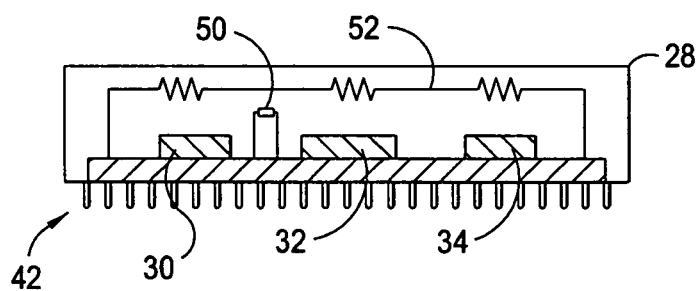
FIG. 5 illustrates an elevational cutaway view of the multiple-chip module.

FIG. 5 illustrates a cross-sectional view of a multi-chip module constructed in accordance with embodiments of the invention. The MCM 28 illustrated in FIG. 5 is shown to have a pin grid array 42 as the external mechanism by which components within the module couple to external devices; however, the pin grid array 42 is only exemplary. FIG. 5 also illustrates that, in accordance with embodiments of the invention, the multi-chip module 28 may comprise an internal heating element 52, such as a resistive heater, and a temperature sensing device 50, such as an RTD. A temperature control circuit, which may either internal or external to the MCM 28, may control the flow of electrical current through the heating element 52 such that the components within the MCM 28 may be operated at a predetermined temperature. For example, electrical component 30 may be an integrated circuit specifically designed or configured for temperature control applications. As previously mentioned, the temperature at which the various components are held is preferably a temperature above the expected ambient temperature. In the exemplary case of use in downhole tools, it is anticipated that the heating element 52 may hold the internal components of the MCM 28 at approximately 220° C., which is above the highest expected ambient temperature for most downhole applications of 200° C. In situations where the highest expected ambient temperature may be lower than 200° C., the temperature at which the resistive element maintains the components within the multi-chip module 28 may likewise be lower.

Figure 6:
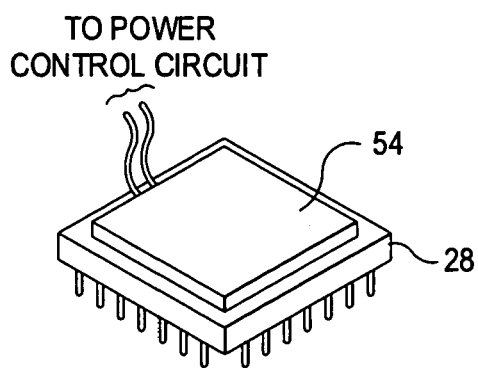
FIG. 6 illustrates a perspective view of the multiple-chip module with a heating element attached to a top surface thereof.

FIG. 6 illustrates embodiments of the MCM 28 utilizing an external heating element 54, in this case coupled to a top surface of the MCM 28. The electrical circuit that controls the heater 54 may be either internal to the multi-chip module 28, or may be external to the MCM 28. In the case of an external circuit, the multi-chip module 28 may nonetheless have an internal temperature sensing device, such as thermal couple or RTD, to measure the internal temperature for control purposes.

Figure 7:
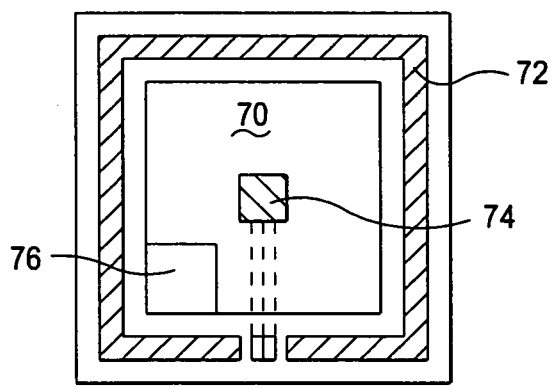
FIG. 7 illustrates an overhead view of an integrated circuit in accordance with at least some embodiments of the invention.

The embodiments of the invention described to this point involve the use of multiple singulated integrated circuits, such as 30, 32 and 34 illustrated in FIG. 4. However, the various heating techniques may also be used when only one singulated integrated circuit is packaged to become a packaged semiconductor device. In situations where only one singulated integrated circuit is used, it may be possible to integrate one or both of the temperature sensing device and the heating element within the integrated circuit device itself. FIG. 7 shows an overhead view of a singulated integrated circuit device in accordance with alternative embodiments of the invention. In particular, one or more electrical components may be built into the region 70. The one or more components in region 70 may implement functionality such as an operational amplifier, a digital logic gate, a receiver circuit, and the like. Constructed on the same integrated circuit may be a heating element 72. FIG. 7 illustrates that the heating element 72 may be formed around the periphery of the electrical component(s) in region 70. However, placement around the periphery is only exemplary, and the heating elements may be dispersed above, below and/or within the electrical component(s) in region 70. In accordance with embodiments of the invention, electrical current may be selectively allowed to flow through the heating element 72, which may simply be a resistive heater, to control the temperature of the electrical component(s) in region 70. The integrated circuit in accordance with these alternative embodiments may also comprise a temperature sensing device 74 in operational relationship to the one or more electrical components in region 70. As illustrated in FIG. 7, the temperature sensing device 74, which may an RTD, is centered within region 70; however, placement of the temperature sensing device 74 is not critical, and may be anywhere on the footprint of the integrated circuit. In some embodiments, a temperature control circuit 76 may be integrated among the one or more electrical components in region 70. The temperature control circuit 76 may read the temperature of the integrated circuit using the temperature sensing device 74, and then selectively control the flow of electrical current through the heating element 72.

In accordance with embodiments of the invention, the integrated circuits which are heated to controlled temperatures above expected ambient temperatures are preferably based on silicon on insulator (SOI) technology. As the name implies, the silicon on insulator technology uses silicon films grown or deposited on insulating substrates. The silicon film may be masked, etched and doped to create components, such as transistors, diodes, resistors and capacitors, which components in combination perform desired functions. By manufacturing the integrated circuits onto an insulating substrate, the effects of high temperature operation, such as leakage current through the substrate, may be reduced so hat the high temperature operation does not severely and/or adversely affect operation. The insulator upon which the components are constructed may be any suitable insulator, such as sapphire and spinal. Thus, the integrated circuits having internal or external heating element illustrated in FIGS. 1-7 above are preferably constructed, at least in part, using integrated circuits based on the silicon on insulator, and in particular silicon on sapphire, construction.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
   placing a downhole tool within a borehole proximate to an earth formation, the downhole tool comprising a multiple-chip module comprising a plurality of singulated semiconductor dies enveloped in an encapsulant; and
   maintaining the multiple-chip module at a predetermined temperature in excess of expected downhole temperatures.

2. The method as defined in claim 1, wherein the multiple-chip module further comprising the plurality of singulated semiconductor dies as silicon on sapphire singulated semiconductor dies.

3. The method as defined in claim 1, wherein maintaining the multiple-chip module at the predetermined temperature further comprises heating the multiple-chip module with a heating element coupled to an exterior surface of the multiple-chip module.

4. The method as defined in claim 1, wherein maintaining the multiple-chip module at the predetermined temperature further comprises heating the multiple-chip module with a heating element disposed within the multiple-chip module.

5. The method as defined in claim 1, further comprising controlling temperature by a temperature control circuit disposed within the multiple-chip module.

6. A downhole tool comprising:

a tool body configured to be placed within a borehole; and an electronic circuit board coupled within the tool body, the electronic circuit board comprising a multiple-chip module, the multiple-chip module comprising a plurality of singulated semiconductor dies enveloped in an encapsulant;

wherein the multiple-chip module is maintained at a predetermined temperature above the highest temperature expected to be encountered by the downhole tool when in the borehole.

7. The downhole tool as defined in claim 6, wherein the multiple-chip module further comprises the plurality of singulated semiconductor dies as silicon on sapphire singulated semiconductor dies.

8. The downhole tool as defined in claim 6, wherein the multiple-chip module further comprises a heating element disposed within the encapsulant of multiple-chip module, and wherein the heating element maintains the multiple-chip module at the predetermined temperature.

9. The downhole tool as defined in claim 6, further comprising a heating element coupled to an exterior surface of the multiple-chip module, and wherein the heating element maintains the multiple-chip module at the predetermined temperature.

* * * * *